United States Patent [19]

Engdahl

[11] 4,216,402
[45] Aug. 5, 1980

[54] SEALED PIEZOELECTRIC RESONATOR WITH INTEGRAL MOUNTING FRAME

[75] Inventor: Jean Engdahl, Bienne, Switzerland

[73] Assignee: Societe Suisse pour l'Industrie Horlogere (SSIH) Management Services, S.A., Switzerland

[21] Appl. No.: 576,173

[22] Filed: May 9, 1975

[30] Foreign Application Priority Data

May 14, 1974 [CH] Switzerland .................. 6556/74

[51] Int. Cl.² ........................................... H01L 41/10
[52] U.S. Cl. ................................. 310/320; 310/344; 310/346; 310/353; 310/368
[58] Field of Search .................. 310/8.2, 8.5, 8.9, 9.1, 310/9.4, 9.5, 9.6, 344, 346, 361, 367, 369, 320

[56] References Cited

U.S. PATENT DOCUMENTS

| | | | |
|---|---|---|---|
| 3,173,035 | 3/1965 | Fisher | 310/9.1 |
| 3,339,091 | 8/1967 | Hammond et al. | 310/9.1 |
| 3,359,435 | 12/1967 | Webb | 310/9.1 |
| 3,396,287 | 8/1968 | Horton | 310/9.1 |
| 3,479,536 | 11/1969 | Norris | 310/8.5 |
| 3,488,530 | 1/1970 | Staudte | 310/8.5 X |
| 3,617,780 | 11/1971 | Benjaminson et al. | 310/346 X |

*Primary Examiner*—Mark O. Budd
*Attorney, Agent, or Firm*—Griffin, Branigan and Butler

[57] ABSTRACT

A piezoelectric resonator assembly comprises a single integral plate which is cut to form a peripheral region for supporting a resonator, a central resonating region for resonating in the longitudinal mode, surface-shear mode, or bending mode, and at least two oppositely positioned arms for fastening the peripheral region to the central region at opposite points on the central resonating region. The arms are positioned at nodal zones of the central resonating region. There is a single gap between the peripheral region and the central resonating region at each position about the central resonating region except at the positions of the arms. The entire upper and lower surfaces of the plate are continuous and have metal plates formed thereon for forming the excitation electrodes of the central resonating region. The metallized plates are attached to leads at the peripheral region. Upper and lower cover elements are also attached to the metallized plates at the peripheral region for covering the central resonating region.

2 Claims, 6 Drawing Figures

U.S. Patent    Aug. 5, 1980    4,216,402
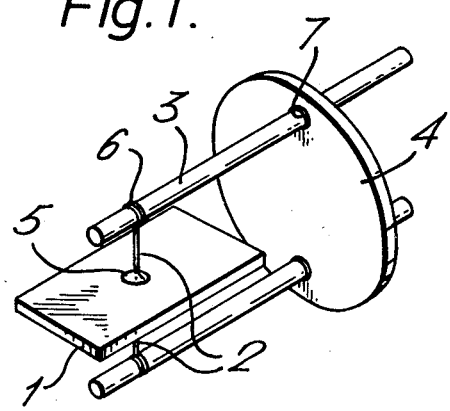
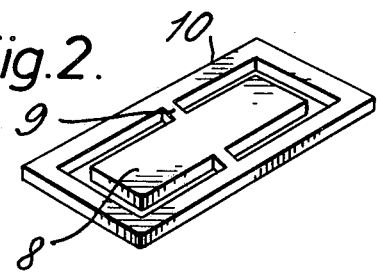
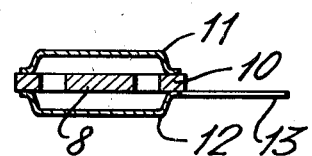
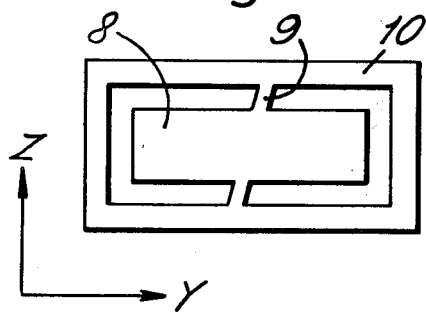
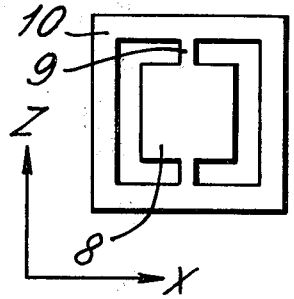
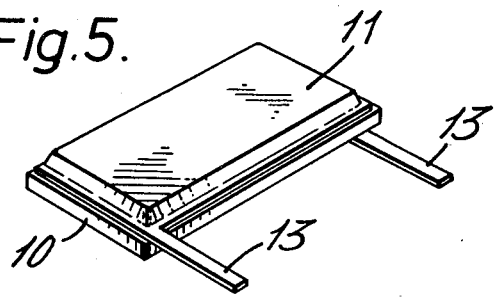

SEALED PIEZOELECTRIC RESONATOR WITH INTEGRAL MOUNTING FRAME

This invention concerns piezoelectric resonators and in particular resonators which may be obtained in extremely small dimensions, but which, nevertheless, exhibit improved performance relative to known resonators.

When it becomes important for certain resonator applications to reduce considerably the maximum allowable dimensions and/or improve certain resonator characteristics, such as the quality factor Q or sensitivity against aging, problems arising from the supporting and encapsulating elements soon become the prime problem which often has been impossible to overcome.

For resonators for extremely small dimensions the overall assembly becomes extremely delicate as much owing to the smallness of the components as to the fact that a non-negligeable portion of the vibration energy is transmitted to the support by elements which provoke mechanical losses through internal friction thereby reducing the quality factor. In particular, such elements are formed by the fastening materials such as weld or soldering materials, conductive adhesives or like materials as well as suspension wires and similar fastening elements.

On the other hand ageing which is manifested by a drift from the designed frequency of the resonator over a period of time depends even more from the manner in which the resonator is supported, the elastic characteristics of the support elements and their temporal stability than from the resonator material, this above all when such is in monocrystalline form.

In known piezoelectric resonators it is customary to try to minimize the lowering of performances owing to the support by fastening the support to nodal points or zones of least vibration amplitude. Such resonators must in general be encased within a hermetically sealed container thereby to keep them free from any contamination and it has become customary to arrange mounting and sealing under vacuum. It is thus necessary to provide means which permit a sealed passage into the enclosure of the essential electric connections. A standard manner in this respect is to utilize glass bulbs having metallic elements providing the passages or metallic capsules provided with passages insulated by glass beads or finally ceramic metal assemblies.

In addition to the problems arising out of volume and quality factor considerations as previously mentioned all the known systems exhibit a serious difficulty of complexity, thus the necessity of using a difficult technology for mass production.

The present invention has for a purpose to overcome these difficulties and proposes a piezelectric resonator comprising a minimum of different components of particularly simplified formation relative to the prior art and suspended in a manner such that the performances are only very slightly affected by the suspension. The arrangements herein taught appear particularly advantageous for resonators designed to operate in the longitudinal mode of vibration, although they may equally be applied to resonators operating in the bending or surface shear modes.

The resonator according to the invention is cut as a single piece from a plate of piezoelectric material and comprises a central region which actually resonates and a peripheral region providing a frame support, these two regions being united by arms fastening the resonator region at its nodal zones. In a preferred form the upper and lower faces of the plate are entirely metallized whereby the metallization simultaneously forms excitation electrodes in the central region and a fastening zone for two encapsulating covers on the periphery of the frame support.

For a better understanding of the description which follows reference will be made to the accompanying drawings in which FIG. 1 is a typical prior art arrangement.

FIG. 2 shows one example of a resonator in accordance with this invention.

FIG. 3 is a cross section showing the same resonator following encapsulation.

FIG. 4a shows a variant of the resonator in which the suspension arms are obliquely arranged relative to the resonator.

FIG. 4b shows a variant arrangement for a resonator vibrating in the surface shear mode.

FIG. 5 is a perspective view of a completed encapsulated assembly.

The standard manner of forming and assembling a resonator may be as shown in FIG. 1. The resonator portion 1 is normally fastened by wires 2 to support elements 3, the latter being fixed to a base 4. The junctions between the various support elements as shown as 5, 6 and 7 may be in the form of brazings or weldings and in general provide critical regions which are the centre of almost all the losses of mechanical energy as mentioned hereinbefore.

An example of an improved resonator in accordance with the invention is as shown in FIGS. 2 and 3. Such a resonator may be obtained through blanking from a plate of piezoelectric material. It is generally rectangular in form and shows three distinct portions which, however, are integrally formed as a single piece:
- a central rectangular portion 8 which provides the resonator proper,
- an external portion 10 which forms a rectangular frame completely surrounding the central portion 8 and separated therefrom by the blanking process,
- support bridges 9 uniting the exterior frame 10 with the resonator 8 in the nodal regions of the latter.

The assembly is provided with metallization over the entire surface of both upper and lower faces. Such metallization may be applied by vacuum evaporation, cathode sputtering or any other suitable process. The metallization provides two distinct functions:
- it provides the excitation electrodes for the resonator within the central portion 8,
- it permits fastening to frame 10 of covers 11 (FIG. 3) by brazing, gluing or conductive adhesives.

Covers 11 comprise metallic sheets formed so as to provide as shown in FIG. 3 an exterior lip 12 capable of being applied to frame 10 while at the same time preventing any other contact between the central portion of the cover and the resonator 8 and arms 9. The contact between lips 12 and the frame 10 is provided around the entire periphery; cover portions 11 may form an hermetic encapsulation whereby the interior may be either provided with protective gas or may be evacuated. The covers likewise provide electric connexions external to the resonator. Preferably they will as shown in FIG. 5 be provided with tabs 13, the remainder of the encapsulation being then protected and insulated by a lacquer or varnish.

In the case of the longitudinal vibration mode there may often arise coupling thereof with a surface shear mode as for example in the well-known X-cut quartz. To limit this undesirable effect arms 9 may be arranged along an oblique axis corresponding to the nodal zone for this vibration mode. Such arrangement is as shown in FIG. 4a.

In the same fashion should a surface shear mode be desired arms 9 as shown in FIG. 4b will be arranged in the centre of the two opposite sides of the resonator.

What is claimed is:

1. A piezoelectric resonator assembly comprising:
   a single integral plate being cut to form a peripheral-region means for supporting said resonator assembly; a central resonating region means for resonating in the longitudinal mode, surface-shear mode or bending mode; and at least two oppositely positioned arm means for fastening the peripheral-region means to the central resonating region means at opposite points on the central resonating region means;
   said arm means being positioned at nodal zones of said central resonating region means;
   there being a single gap between said peripheral region and said central resonating region at substantially all positions about said central resonating region except at the positions of the arms;
   wherein the substantially entire upper and lower surfaces of said single integral plate are continuous in that they are uninterrupted by substantial angles therein and wherein are further included upper and lower metallized plates formed on the respective entire upper and lower surfaces thereof to form excitation electrodes for said central resonating region means, said electrodes being energized by energizing leads attached to said metallized plates at said peripheral region.

2. A piezoelectric resonator according to claim 1 wherein is further included upper and lower cover elements, the upper cover element being attached to said upper metallized plate at said peripheral region, and the lower cover element being attached to said lower metallized plate at said peripheral region, said cover elements covering their respective surfaces to provide encapsulation of said central resonating region means.

* * * * *